(12) United States Patent
Koshihara

(10) Patent No.: US 9,806,135 B2
(45) Date of Patent: Oct. 31, 2017

(54) LIGHT EMITTING DEVICE AND ELECTRONIC APPARATUS

(71) Applicant: SEIKO EPSON CORPORATION, Tokyo (JP)

(72) Inventor: Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/476,281

(22) Filed: Sep. 3, 2014

(65) Prior Publication Data

US 2015/0084022 A1    Mar. 26, 2015

(30) Foreign Application Priority Data

Sep. 20, 2013  (JP) ................. 2013-195080

(51) Int. Cl.
  *H01L 27/32*  (2006.01)

(52) U.S. Cl.
  CPC ...... *H01L 27/3246* (2013.01); *H01L 27/3276* (2013.01); *H01L 2227/323* (2013.01)

(58) Field of Classification Search
  CPC ............. H01L 27/3246; H01L 27/3276; H01L 2227/323

USPC .......................................... 257/40
See application file for complete search history.

(56) References Cited

U.S. PATENT DOCUMENTS

2007/0087645 A1    4/2007    Tsujii et al.

FOREIGN PATENT DOCUMENTS

| JP | 2007-115464 A | 5/2007 |
| JP | 2008-091051 A | 4/2008 |
| JP | A-2012-84371 | 4/2012 |
| JP | A-2012-138226 | 7/2012 |

*Primary Examiner* — Hrayr A Sayadian
(74) *Attorney, Agent, or Firm* — Oliff PLC

(57) ABSTRACT

A light emitting device according to the invention includes a first pixel electrode; a second pixel electrode; an organic layer including a light emitting layer; a pixel separation layer being interposed between an outer edge portion of the first pixel electrode and an outer edge portion of the second pixel electrode, and the organic layer, and separating a first pixel area and a second pixel area; and a common electrode provided on a side opposite to a side on which the first pixel electrode and the second pixel electrode of the organic layer are provided, wherein a width overlapped between the pixel separation layer and the first pixel electrode in the planar view and a width overlapped between the pixel separation layer and the second pixel electrode in the planar view are greater than a film thickness of the organic layer or a charge transfer layer.

20 Claims, 10 Drawing Sheets

LIGHT EMITTING DEVICE AND ELECTRONIC APPARATUS

BACKGROUND

1. Technical Field

The present invention relates to a light emitting device and an electronic apparatus.

2. Related Art

In the related art, a light emitting device in which a plurality of organic electroluminescence (hereinafter, simply referred to as EL) elements are disposed in a matrix shape is used as a display apparatus of the electronic apparatus is used (for example, see JP-A-2012-138226). The respective organic EL elements are connected to power supply lines through drive transistors, and emit light at brightness corresponding to drive currents supplied from the power supply lines. An active matrix-type organic EL apparatus in which the plurality of power supply lines are provided in a display area in a manner corresponding to the plurality of signal lines one by one is suggested (for example, see JP-A-2012-084371).

Generally, in a light emitting device such as an organic EL apparatus, a pixel electrode, a light emitting layer, and a common electrode are sequentially stacked on a substrate, and the light emitting layer emits light by currents flowing between the pixel electrode and the common electrode. However, since the pixel electrodes are disposed in a matrix shape in an active matrix-type light emitting device, if potentials of the adjacent pixel electrodes are different from each other, leakage currents may flow between the adjacent pixel electrodes. In this case, since the currents which contribute to light emission which flow from the pixel electrodes to the common electrodes flow to the adjacent pixel electrodes, desired gradations and color tones may not be obtained, and a display quality decreases. This is a remarkable problem in the light emitting device for the high-definition display apparatus in which pixel gaps are narrow.

SUMMARY

An advantage of some aspects of the invention is to provide a light emitting device that can decrease leakage currents between adjacent pixel electrodes. An advantage of some aspects of the invention is to provide an electronic apparatus including this kind of light emitting device, and a display unit having a prominent display quality.

According to an aspect of the invention, there is provided a light emitting device including: a first pixel electrode; a second pixel electrode; an organic layer including a light emitting layer; a pixel separation layer interposed between an outer edge portion of the first pixel electrode and an outer edge portion of the second pixel electrode, and the organic layer; and a common electrode provided on the organic layer, wherein a width overlapped between the pixel separation layer and the first pixel electrode in the planar view and a width overlapped between the pixel separation layer and the second pixel electrode in the planar view are greater than a film thickness of the organic layer.

In the light emitting device according to the aspect of the invention, the first pixel electrode and the second pixel electrode are overlapped with the organic layer in the planar view, and the width overlapped between the first pixel electrode and the second pixel electrode in the pixel separation layer are greater than a film thickness of the organic layer. Accordingly, the components can be diagnosed to have a structure in which an organic thin film transistor (hereinafter simply referred to as TFT) in which a portion overlapped with the pixel separation layer from the first pixel electrode and the second pixel electrode is set to be a gate, the other portion is set to be a source or a drain, and an organic layer positioned on the pixel separation layer overlapped with the first pixel electrode and the second pixel electrode is set to be the channel area is subjected to diode connection. As a result, since the resistance between the first pixel electrode and the second pixel electrode becomes high by the diode connection structure, the current between the first pixel electrode and the second pixel electrode is suppressed. In this manner, the light emitting device that can decrease the leakage current between the adjacent pixel electrodes can be realized.

In the light emitting device according to the aspect of the invention, it is preferable that a film thickness of the pixel separation layer is thinner than the film thickness of the organic layer.

According to this configuration, the influence of the diode connection is strong, and the current between the first pixel electrode and the second pixel electrode is more sufficiently suppressed.

In the light emitting device according to the aspect of the invention, it is preferable that the overlapped widths are equal to or greater than 3 times and equal to or less than 10 times the film thickness of the organic layer.

According to this configuration, since the width overlapped with the organic layer is sufficiently secured, the effect of the diode connection can be caused to be strong. Accordingly, the current between the first pixel electrode and the second pixel electrode is more sufficiently suppressed.

In the light emitting device according to the aspect of the invention, it is preferable that a gap between a first pixel area of the first electrode and a second pixel area of the second electrode is equal to or less than 20 times the film thickness of the organic layer.

According to this configuration, since pixel gaps become narrow, the problem of the leakage current between the adjacent pixel electrodes become more remarkable. Accordingly, the effect of the light emitting device according to an aspect of the invention becomes more effective.

According to another aspect of the invention, there is provided a light emitting device including a first pixel electrode; a second pixel electrode; a light emitting layer; a charge transfer layer provided between the light emitting layer, and the first pixel electrode and the second pixel electrode; a pixel separation layer interposed between an outer edge portion of the first pixel electrode and an outer edge portion of the second pixel electrode, and the charge transfer layer; and a common electrode provided on the light emitting layer, wherein a width overlapped between the pixel separation layer and the first pixel electrode in the planar view and a width overlapped between the pixel separation layer and the second pixel electrode in the planar view are greater than a film thickness of the charge transfer layer.

In the light emitting device according to the aspect of the invention, the first pixel electrode and the second pixel electrode are overlapped with the charge transfer layer in the planar view, and the width overlapped between the first pixel electrode and the second pixel electrode in the pixel separation layer are greater than a film thickness of the charge transfer layer. Accordingly, the components can be diagnosed to have a structure in which an organic thin film transistor (hereinafter simply referred to as TFT) in which a portion overlapped with the pixel separation layer from the first pixel electrode and the second pixel electrode is set to be a gate, and the other portion is set to be a source or a drain, and the charge transfer layer positioned on the pixel separation layer overlapped with the first pixel electrode and the second pixel electrode is set to be the channel area is subjected to diode connection. As a result, since the resistance between the first pixel electrode and the second pixel electrode becomes high by the diode connection structure, the current between the first pixel electrode and the second pixel electrode is suppressed. In this manner, the light emitting device that can decrease the leakage current between the adjacent pixel electrodes can be realized.

In the light emitting device according to the aspect of the invention, it is preferable that a film thickness of the pixel separation layer is thinner than the film thickness of the charge transfer layer.

According to this configuration, the influence of the diode connection is strong, and the current between the first pixel electrode and the second pixel electrode is more sufficiently suppressed.

In the light emitting device according to the aspect of the invention, it is preferable that the overlapped width is equal to or greater than 3 times and equal to or less than 10 times the film thickness of the organic layer including the light emitting layer and the charge transfer layer.

According to this configuration, since the width overlapped with the organic layer is sufficiently secured, the effect of the diode connection can be caused to be strong. Accordingly, the current between the first pixel electrode and the second pixel electrode is more sufficiently suppressed.

In the light emitting device according to the aspect of the invention, it is preferable that a gap between a first pixel area of the first electrode and a second pixel area of the second electrode is equal to or less than 20 times the film thickness of the organic layer including the light emitting layer and the charge transfer layer.

According to this configuration, since pixel gaps become narrow, the problem of the leakage current between the adjacent pixel electrodes become more remarkable. Accordingly, the effect of the light emitting device according to an aspect of the invention becomes more effective.

In the light emitting device according to the aspect of the invention, the light emitted from the light emitting layer may be emitted from the common electrode side.

According to the configuration, in a top emission-type light emitting device, the leakage current between the adjacent pixel electrodes can be decreased.

In the light emitting device according to the aspect of the invention, light emitted from the light emitting layer may be emitted from the first pixel electrode or the second pixel electrode.

According to the configuration, in a bottom emission-type light emitting device, the leakage current between the adjacent pixel electrodes can be decreased.

According to still another aspect of the invention, there is provided an electronic apparatus comprising the light emitting device according to the aspects of the invention.

According to the aspect of the invention, the electronic apparatus including a display unit having a prominent display quality can be realized by providing the light emitting device according to the aspects of the invention.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
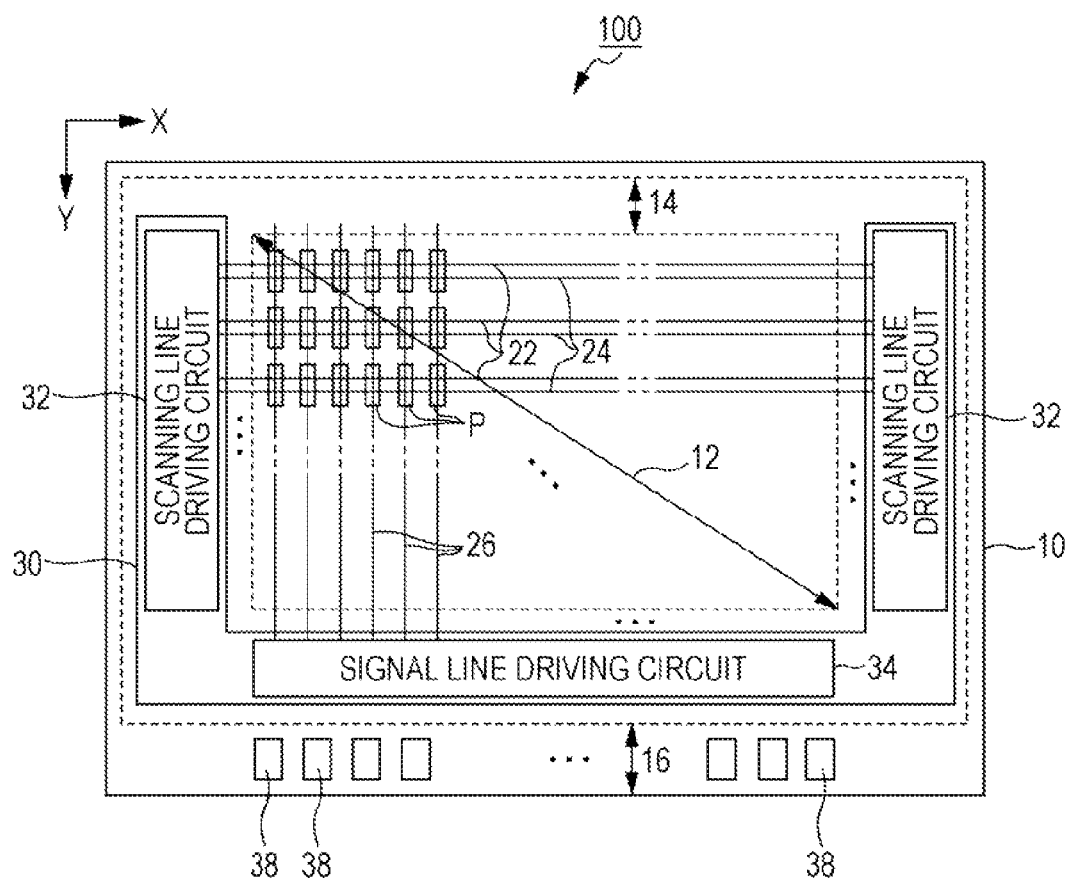
FIG. 1 is a plan view of a light emitting device according to a first embodiment.

Hereinafter, a first embodiment of the invention is described with reference to FIGS. 1 to 9.

A light emitting device according to the first embodiment is an example of a top emission-type organic EL apparatus that emits light from a sealing layer (common electrode) side.

In the drawings, for easier understanding of components, reduced scales of dimensions by the component may be differently illustrated.

FIG. 1 is a plan view of a light emitting device 100 according to the first embodiment.

The light emitting device 100 according to the first embodiment is an organic EL apparatus in which a light emitting device using an organic EL material is formed on a substrate 10. The substrate 10 is a plate-shaped member (semiconductor substrate) formed by a semiconductor material such as silicon, and is used as a substrate on which a plurality of light emitting devices are formed.

As illustrated in FIG. 1, a display area 12, a peripheral area 14, and a mounting area 16 are provided on the front surface of the substrate 10. The display area 12 is a rectangular-shaped area on which a plurality of pixels P are arranged. A plurality of scanning lines 22 extending in an X direction, a plurality of control lines 24 corresponding to the scanning lines 22 and extending in the X direction, and a plurality of signal lines 26 intersecting the X direction and extending in a Y direction are formed on the display area 12. The pixels P are areas corresponding to respective intersections of the plurality of scanning lines 22 and the plurality of signal lines 26. Accordingly, the plurality of pixels P are arranged in a matrix shape in the X direction and Y direction.

The peripheral area 14 is a rectangular frame shaped area enclosing the display area 12. A drive circuit 30 is provided with the peripheral area 14. The drive circuit 30 is a circuit that drives the pixels P in the display area 12. The drive circuit 30 includes two scanning line drive circuits 32 and a signal line drive circuit 34. The light emitting device 100 is a circuit-integrated display apparatus configured with an active element such as a transistor in which the drive circuit 30 is directly formed on the front surface of the substrate 10. Further, a dummy pixel that does not directly contribute to an image display may be formed in the peripheral area 14.

The mounting area 16 is provided in an area on a side (that is, the outside of the peripheral area 14) opposite to the display area 12 through the peripheral area 14. A plurality of mounting terminals 38 are arranged on the mounting area 16. Control signals and power supply potentials are supplied from various external circuits (not illustrated) such as a control circuit or a power supply circuit to the mounting terminals 38. The external circuit is mounted on a flexible wire substrate (not illustrated) connected to, for example, the mounting area 16.

Figure 2:
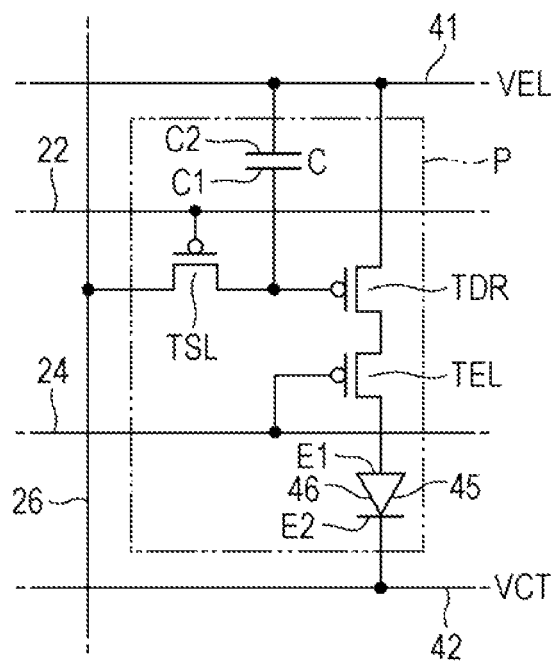
FIG. 2 is an equivalent circuit diagram illustrating a pixel configuring the light emitting device.

FIG. 2 is a circuit diagram illustrating one pixel (pixel circuit) P in the display area 12.

As illustrated in FIG. 2, the pixel P includes a light emitting device 45, a drive transistor TDR, a light emission control transistor TEL, a selection transistor TSL, and a capacitive element C. Further, according to the first embodiment, transistors (TDR, TEL, and TSL) of the pixel P are configured with P-channel type transistors, but may be configured with N-channel type transistors.

The light emitting device 45 is an electro-optical element interposing an organic layer 46 including a light emitting layer of an organic EL material between a pixel electrode (anode) E1 and a common electrode (cathode) E2. The pixel electrode E1 is separately formed for each pixel P, and the common electrode E2 is continuously formed along the plurality of pixels P.

As illustrated in FIG. 2, the light emitting device 45 is disposed on a current path joining a first power supply conductor 41 and a second power supply conductor 42. The first power supply conductor 41 is power supply wiring to which a high potential side power supply potential VEL is supplied. The second power supply conductor 42 is power supply wiring to which a low potential side power supply potential VCT is supplied.

The drive transistor TDR and the light emission control transistor TEL are connected to the light emitting device 45 in series on the current path joining the first power supply conductor 41 and the second power supply conductor 42. Specifically, one side (source) of a pair of current terminals of the drive transistor TDR is connected to the first power supply conductor 41. The light emission control transistor TEL functions as a switch that controls a conduction state (conduction/non-conduction) between the other end (drain) of the pair of current terminals of the drive transistor TDR and the pixel electrode E1 of the light emitting device 45. The drive transistor TDR generates a driving current corresponding to the current amount corresponding to a voltage between the source and a gate of the drive transistor TDR.

In a state in which the light emission control transistor TEL is controlled in an ON state, the drive current is supplied from the drive transistor TDR to the light emitting device 45 through the light emission control transistor TEL. At this point, the light emitting device 45 emits light at the brightness corresponding to the current amount of the drive current. In a state in which the light emission control transistor TEL is controlled in an OFF state, the supply of the drive current to the light emitting device 45 is blocked. At this point, the light emitting device 45 turns the light off. The gate of the light emission control transistor TEL is connected to the control line 24.

The selection transistor TSL illustrated in FIG. 2 functions as a switch that controls the conduction state (conduction/non-conduction) between the signal lines 26 and the drive transistor TDR. The gate of the selection transistor TSL is connected to the scanning line 22. The capacitive element C is an electrostatic capacity interposing a dielectric between a first capacitance electrode C1 and a second capacitance electrode C2. The first capacitance electrode C1 is connected to the gate of the drive transistor TDR. The second capacitance electrode C2 is connected to the first power supply conductor 41 (the source of the drive transistor TDR). Accordingly, the capacitive element C maintains the voltage between the gate and the source of the drive transistor TDR.

The signal line drive circuit 34 illustrated in FIG. 1 supplies image signals supplied from the external circuit to the plurality of signal lines 26 in parallel for each write period (horizontal scanning period) as gradation potentials (data signals) corresponding to a gradation designated for each pixel P. Meanwhile, the scanning line drive circuits 32 sequentially selects each of the plurality of scanning lines 22 for each write period by supplying scanning signals to each of the plurality of scanning lines 22. The selection transistor TSL of the pixel P corresponding to the scanning line 22 selected by the scanning line drive circuit 32 transitions to the ON state. At this point, the gradation potentials are supplied to each gate of the drive transistor TDR of the pixel P through the signal lines 26 and the selection transistor TSL, and the voltage corresponding to the gradation potentials are stored in the capacitive element C.

Meanwhile, when the selection of the scanning lines 22 in the write period ends, the scanning line drive circuit 32 performs control so that the light emission control transistor TEL of the pixel P corresponding to the control line 24 is in the ON state by supplying the control signals to the respective control lines 24. Accordingly, the drive current corresponding to the voltage stored in the capacitive element C immediately before the write period is supplied to the light emitting device 45 from the drive transistor TDR through the light emission control transistor TEL. As described above, the light emitting device 45 emits light at the brightness corresponding to the gradation potential so that an arbitrary image designated by the image signal is displayed on the display area 12.

Figure 3:
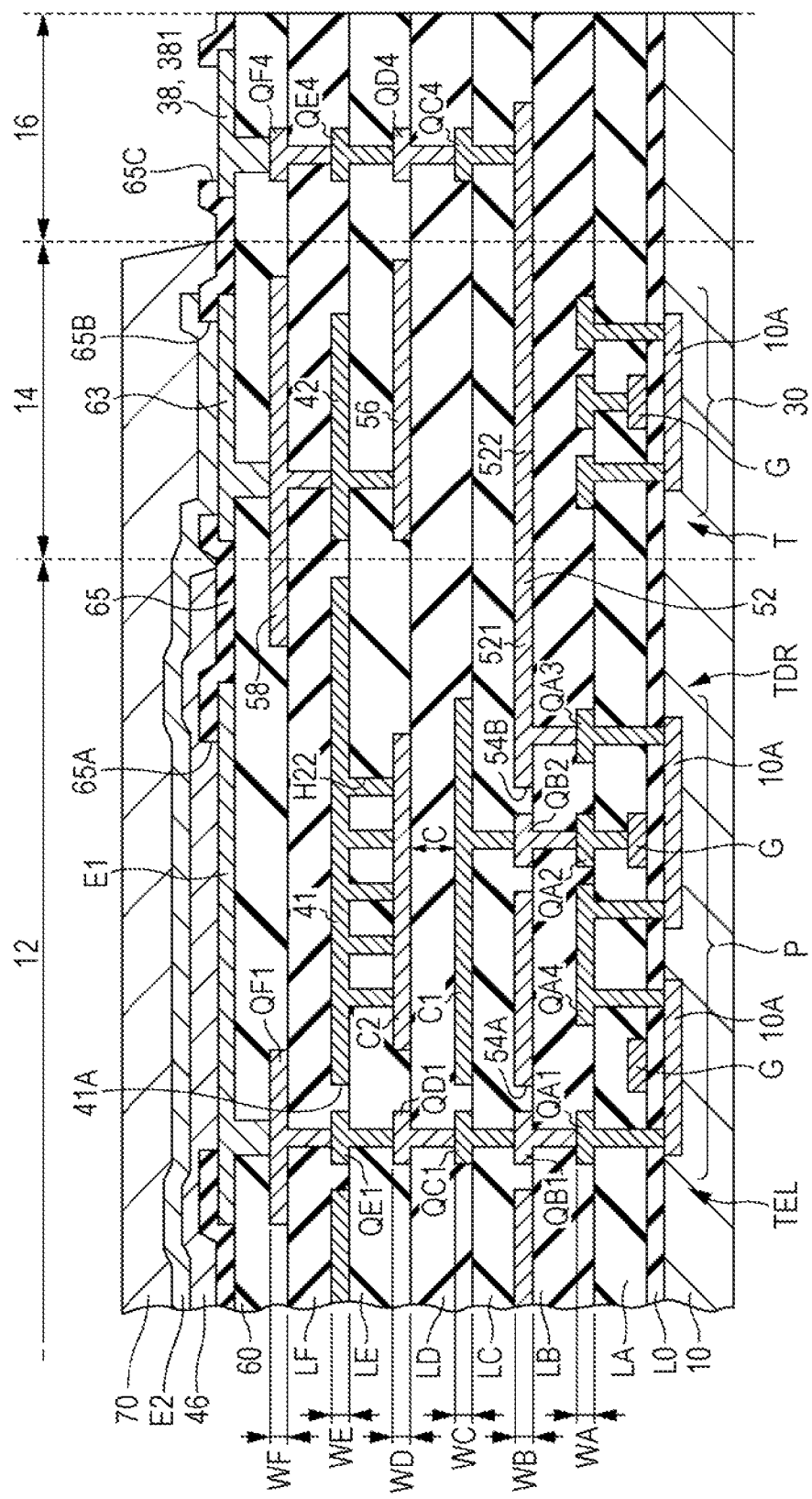
FIG. 3 is a cross-sectional view illustrating the light emitting device.

FIG. 3 is a cross-sectional view illustrating the light emitting device 100.

As illustrated in FIG. 3, the transistors T (TDR, TEL, and TSL) of the pixel P are formed in the display area 12 on the front surface of the substrate 10 formed by the semiconductor material such as silicon, and the transistors T of the drive circuit 30 are formed in the peripheral area 14. The transistors T each include an active area 10A (source/drain area) formed on the front surface of the substrate 10, an insulation layer L0 (gate insulation film) that covers the front surface of the substrate 10, and a gate G formed on the insulation layer L0. The active areas 10A are configured in ion implantation areas to which impurity ions are implanted in the substrate 10. The channel areas of the transistors T (TDR, TEL, and TSL) of the pixels P exist between the source areas and the drain areas. Ions different from those in the active areas 10A are implanted in the channel areas, but the difference is not illustrated in the drawings. The gates G of the respective transistors T are disposed in positions that face the channel area through the insulation layer L0.

As illustrated in FIG. 3, a multilayered wire layer obtained by alternately stacking a plurality of insulation layers (LA to LF) and a plurality of wire layers (WA to WF) is formed on the insulation layer L0 in which the gates G of the respective transistors T are formed. The respective insulation layers are formed by insulating inorganic materials such as a silicon compound (typically, silicon nitride or silicon oxide). The respective wire layers W are formed by a low-resistance conductive material containing aluminum, silver, or the like. In the description below, a relationship of collectively forming a plurality of elements in the same step by selectively removing conductive layers (a single layer or multiple layers) is referred to as "being formed from the same layer".

An insulation layer LA of FIG. 3 is formed on the surface of the insulation layer L0 on which the gates G of the respective transistors T are formed. Semiconductor patterns including a plurality of relay electrodes QA (QA1 to QA4) are formed from the same layer (the wire layer WA) on the surface of the insulation layer LA. The relay electrode QA1 conducts electricity to the active area 10A (drain) of the light emission control transistor TEL through the conduction hole (contact hole) penetrating the insulation layer LA and the insulation layer L0. The relay electrode QA2 conducts electricity to the gate G of the drive transistor TDR through the conduction hole penetrating the insulation layer LA. The relay electrode QA3 conducts electricity to the active area 10A (source) of the drive transistor TDR through the conduction hole penetrating the insulation layer LA and the insulation layer L0. The relay electrode QA4 conducts electricity to the active area 10A (source) of the light emission control transistor TEL and the active area 10A (drain) of the drive transistor TDR through conduction holes penetrating the insulation layer LA and the insulation layer L0. That is, the drive transistor TDR and the light emission control transistor TEL are connected in series as illustrated in FIG. 2. Further, the selection transistor TSL and specific wires relating to the transistors T in the drive circuit 30 are not illustrated for convenience.

An insulation layer LB of FIG. 3 is formed on the surface of the insulation layer LA on which the wire layer WA is formed. A semiconductor pattern including a connection conductor 52 and a plurality of relay electrodes QB (QB1 and QB2) is formed from the same layer (wire layer WB) on the surface of the insulation layer LB. The connection conductor 52 conducts electricity to the relay electrode QA3 of the wire layer WA through conduction holes penetrating the insulation layer LB. That is, the connection conductor 52 conducts electricity to the active area 10A (source) of the drive transistor TDR.

Figure 4:
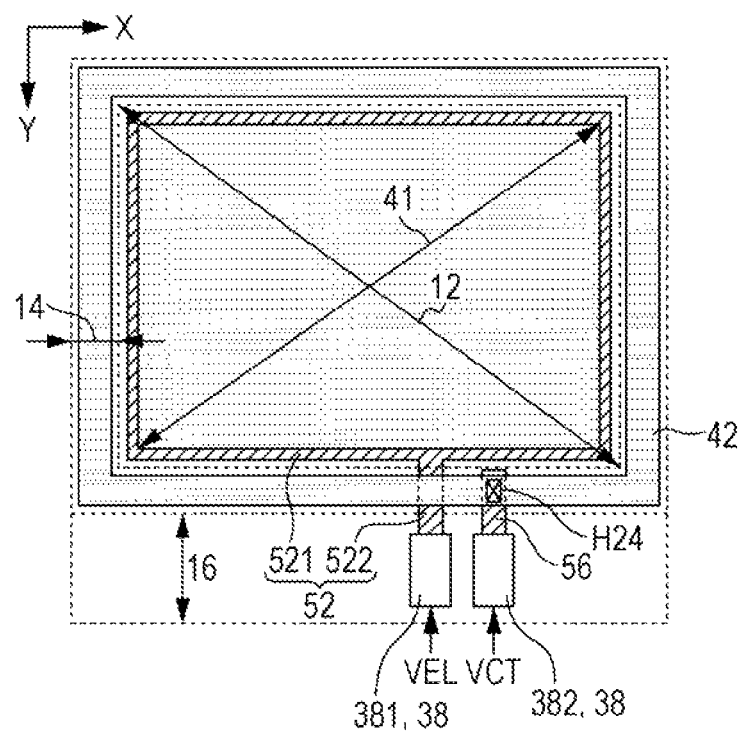
FIG. 4 is a diagram illustrating a positional relationship of components relating to a supply of power supply potentials.

FIG. 4 is a diagram schematically illustrating elements relating to the supply of the power supply potentials (VEL and VCT) among the light emitting device 100.

As illustrated in FIG. 4, the connection conductor 52 is a semiconductor pattern including a conductive portion 521 and a conductive portion 522. The conductive portion 521 is an almost rectangular-shaped solid pattern throughout the entire region of the display area 12 in the planar view. The solid pattern is not a linear pattern or a belt-shaped pattern, or the combination thereof (for example, a grid shape), but means a uniformly connected planar semiconductor pattern that covers almost the entire surface of the display area 12 other than at least the conduction opening portion or the like.

Figure 5:
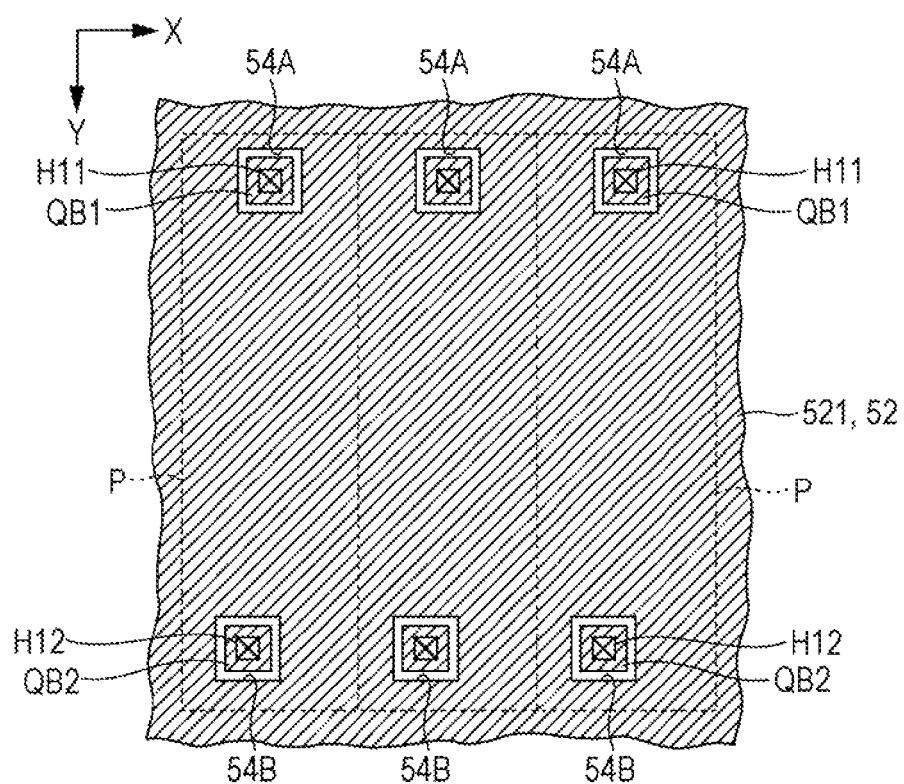
FIG. 5 is a plan view illustrating a connection conductor.

FIG. 5 is a diagram schematically illustrating a portion corresponding to three pixels P adjacent in the X direction in the conductive portion 521.

As illustrated in FIG. 5, an opening portion 54A and an opening portion 54B are formed on the conductive portion 521 for each of the pixels P. The relay electrode QB1 is formed inside the opening portion 54A. The relay electrode QB2 is formed inside the opening portion 54B. In other words, the conductive portion 521 has the opening portion 54A and the opening portion 54B, and is formed throughout the entire portion of the display area 12 in the planar view so that the relay electrode QB1 and the relay electrode QB2 are enclosed. The opening portion 54A and the opening portion 54B are openings for electrically conducting the element on the upper layer and the element on the lower layer of the wire layer WB (that is, openings through which the paths connecting the upper layer element and the lower layer element pass). The relay electrode QB1 and the relay electrode QB2 are electrically insulated from the connection conductor 52 by being formed at positions and in formations for being separate from the connection conductor 52.

As illustrated in FIGS. 3 and 5, the relay electrode QB1 conducts electricity to the relay electrode QA1 of the wire layer WA through conduction holes H11 penetrating the insulation layer LB. The relay electrode QB2 conducts electricity to the relay electrode QA2 of the wire layer WA through conduction holes H12 penetrating the insulation layer LB.

As illustrated in FIG. 4, the conductive portion 522 (first conductive portion) of the connection conductor 52 is a linear semiconductor pattern extending from the conductive portion 521 positioned in the display area 12 to the mounting area 16 by penetrating the peripheral area 14. The conductive portion 522 is electrically connected to a mounting terminal 381 to which the high potential side power supply potential VEL is supplied among the plurality of mounting terminals 38 disposed on the mounting area 16.

As illustrated in FIG. 3, an insulation layer LC is formed on the surface of the insulation layer LB on which the wire layer WB is formed. The first capacitance electrode C1 of the capacitive element C and semiconductor patterns including a plurality of relay electrodes QC (QC1 and QC4) are formed from the same surface (wire layer WC) on the surface of the insulation layer LC. The first capacitance electrode C1 conducts electricity to the relay electrode QB2 of the wire layer WB through the conduction holes penetrating the insulation layer LC. That is, as illustrated in FIG. 2, the first capacitance electrode C1 of the capacitive element C conducts electricity to the gate G of the drive transistor TDR through the relay electrode QB2 and the relay electrode QA2. The relay electrode QC1 of FIG. 3 conducts electricity to the relay electrode QB1 through the conduction holes penetrating the insulation layer LC. The relay electrode QC4 is formed in the mounting area 16, and conducts electricity to the connection conductor 52 (the conductive portion 522) through the insulation layer LC.

An insulation layer LD of FIG. 3 is formed on the surface of the insulation layer LC on which the wire layer WC is formed. A semiconductor pattern including the second capacitance electrode C2, a plurality of relay electrodes QD (QD1 and QD4), and a conductive portion 56 of the capacitive element C are formed from the same surface (wire layer WD) on the surface of the insulation layer LD. The second capacitance electrode C2 is formed at positions and in formations for being overlapped with the first capacitance electrode C1 in the planar view. Accordingly, the capacitive element C having a configuration in which the first capacitance electrode C1 and the second capacitance electrode C2 interpose the insulation layer LD is formed for each of the pixels P.

The relay electrode QD1 conducts electricity to the relay electrode QC1 of the wire layer WC through the conduction holes penetrating the insulation layer LD. The relay electrode QD4 is formed in the mounting area 16, and conducts electricity to the relay electrode QC4 of the wire layer WC through the conduction holes penetrating the insulation layer LD. Meanwhile, the conductive portion 56 is a semiconductor pattern extending from the peripheral area 14 to the mounting area 16 as illustrated in FIG. 4. The conductive portion 56 is electrically connected to a mounting terminal 382 to which the low potential side power supply potential VCT is supplied.

An insulation layer LE of FIG. 3 is formed on the surface of the insulation layer LD on which the wire layer WD is formed. A semiconductor pattern including the first power supply conductor 41, the second power supply conductor 42, and a plurality of relay electrodes QE (QE1 and QE4) is formed from the same layer (wire layer WE) on the surface of the insulation layer LE. The wire layer WE is formed by a light reflecting conductive material containing aluminum, silver, or the like.

The relay electrode QE1 conducts electricity to the relay electrode QD1 of the wire layer WD through the conduction holes penetrating the insulation layer LE. The relay electrode QE4 is formed on the mounting area 16, and conducts electricity to the relay electrode QD4 of the wire layer WD through the conduction holes penetrating the insulation layer LE. As illustrated in FIG. 3, the relay electrode QE4 is electrically connected to the supplying mounting terminal 381 of a power supply potential VEL through a relay electrode QF4 to be described below. That is, the mounting terminal 381 of the power supply potential VEL conducts electricity to the connection conductor 52 (conductive portion 522) through the relay electrode QF4, the relay electrode QE4, the relay electrode QD4, and the relay electrode QC4.

As illustrated in FIG. 4, the first power supply conductor 41 is formed into a rectangular-shaped solid pattern throughout almost the entire portion of the display area 12 in the planar view in the same manner as that of the conductive portion 521 of the connection conductor 52. As described above, the first power supply conductor 41 is formed by the light reflecting conductive material containing aluminum, silver, or the like. Specifically, the first power supply conductor 41 may be formed by a single material such as aluminum or silver, or may be configured with, for example, a layered film such as titanium (Ti)/aluminum copper alloy (AlCu).

Figure 6:
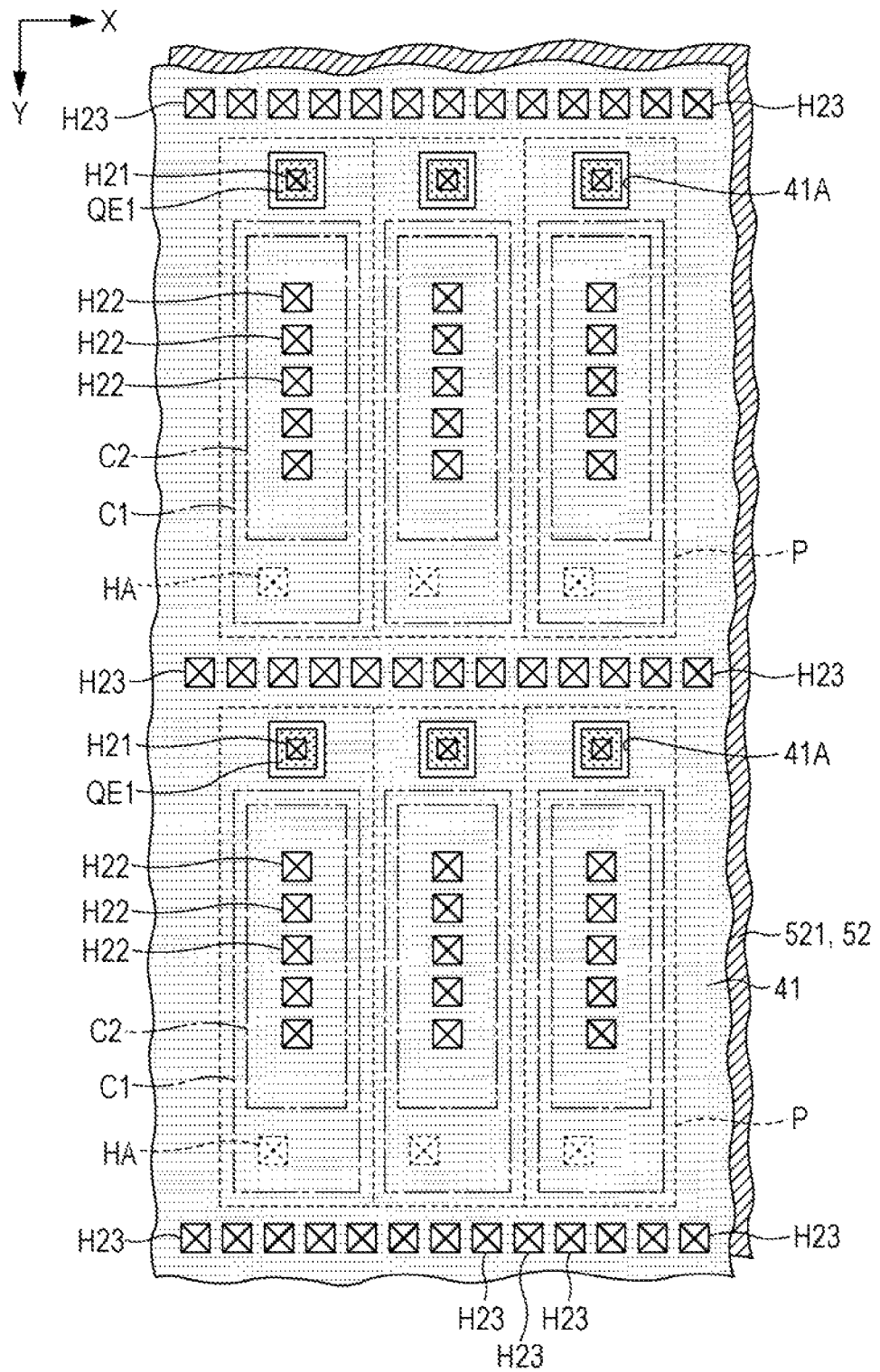
FIG. 6 is a plan view illustrating a first power supply conductor.

FIG. 6 is a partial plan view illustrating the first power supply conductor 41.

As illustrated in FIG. 6, the first power supply conductor 41 is a uniformly connected planar semiconductor pattern that covers almost the entire surface of the display area 12 other than at least the opening portion 41A formed for each of the pixels P. The aforementioned relay electrode QE1 is formed inside the opening portion 41A. Specifically, the relay electrode QE1 is formed inside the opening portion 41A at positions and in formations for being separate from the first power supply conductor 41 and is electrically insulated from the first power supply conductor 41.

Further, in FIG. 4, the opening portion 41A and the relay electrode QE1 are not illustrated. As described above, the first power supply conductor 41 has the opening portion 41A, and is formed over almost the entire portion of the display area 12 in the planar view so as to enclose the relay electrode QE1. The opening portion 41A is an opening for electrically conducting the element on the upper layer of the wire layer WE and the element on the lower layer (that is, an opening through which a path that connects the element on the upper layer and the element on the lower layer pass).

The first power supply conductor 41 according to the first embodiment is formed into a planar shape so that 80% or more of the display area 12 is occupied in the planar view. Preferably, the first power supply conductor 41 occupies 90% or more of the display area 12. More preferably, the first power supply conductor 41 occupies 95% or more of the display area 12. For example, if it is assumed that the opening portion 41A is formed into a rectangular shape of 0.9 μm in height×0.9 μm in width, and the dimension of the pixel P is a rectangular shape of 7.5 μm in height×2.5 μm in width, the first power supply conductor 41 is formed to occupy about 96% of the display area 12. In the same manner, the aforementioned conductive portion 521 of the connection conductor 52 is closely formed to occupy 80% or more of the display area 12 in the planar view, and preferably occupy 90% or more (more preferably 95% or more) of the display area 12.

As illustrated in FIGS. 3 and 6, the first power supply conductor 41 conducts electricity to the second capacitance electrode C2 of the wire layer WD through a plurality of conduction holes H22 penetrating the insulation layer LE. The plurality (five) of conduction holes H22 arranged in the Y direction are formed for each of the pixels P. As illustrated in FIG. 6, the first power supply conductor 41 conducts electricity to the connection conductor 52 (the conductive portion 521) of the wire layer WB through a plurality of conduction holes H23 penetrating insulation layers L (LE, LD, and LC) positioned between the layers of the first power supply conductor 41 and the connection conductor 52 (the conductive portion 521). The plurality of conduction holes H23 are formed in an area between the respective pixels P adjacent to each other in the planar view. Specifically, the plurality of conduction holes H23 are linearly arranged in the X direction in a belt-shaped area (between the respective lines of the pixels P) extending in the X direction in gaps between the pixels P adjacent to each other in the Y direction. That is, the plurality of conduction holes H23 in the X direction are paralleled in the Y direction in the gaps between the plurality of lines.

As described above, the first power supply conductor 41 conducts electricity to the connection conductor 52 through the conduction holes H23. That is, as illustrated in FIGS. 3 and 6, the first power supply conductor 41 conducts electricity to the active area 10A (source) of the drive transistor TDR through the conductive portion 521 of the connection conductor 52 and the relay electrode QA3, and conducts electricity to the supplying mounting terminal 381 of the power supply potential VEL from the conductive portion 521 and the conductive portion 522 of the connection conductor 52 and the relay electrode QC4 through the relay electrode QF4.

As illustrated in FIG. 4, the second power supply conductor 42 is a belt-shaped electrode formed in the peripheral area 14 on the circumference of the display area 12. Specifically, the second power supply conductor 42 is formed into a ring shape enclosing the first power supply conductor 41 in the planar view (a closed figure of a rectangular frame shape). Accordingly, the drive circuit 30 configured with the transistors T in the peripheral area 14 on the front surface of the substrate 10 is covered with the second power supply conductor 42. The first power supply conductor 41 and the second power supply conductor 42 are formed to be separate from each other so as to be electrically insulated. As illustrated in FIGS. 3 and 4, the second power supply conductor 42 conducts electricity to the conductive portion 56 of the wire layer WD through a conduction hole H24 penetrating the insulation layer LE. That is, the low potential side power supply potential VCT supplied to the mounting terminal 382 is supplied to the second power supply conductor 42 through the conductive portion 56.

As illustrated in FIGS. 3 and 4, the conductive portion 522 of the connection conductor 52 is formed on a surface different from that of the second power supply conductor 42, and extends from the conductive portion 521 in the display area 12 to the mounting area 16 by passing through the lower layer of the second power supply conductor 42 in the peripheral area 14 (that is, sterically intersects with the second power supply conductor 42). That is, the conductive portion 522 of the connection conductor 52 is overlapped with the second power supply conductor 42 in the planar view.

A first optical adjustment layer LF of FIG. 3 is formed on the surface of the insulation layer LE on which the wire layer WF is formed. A semiconductor pattern including a plurality of relay electrodes QF (QF1 and QF4) and a protection conductive layer 58 is formed from the same layer (wire layer WF) on the surface of the first optical adjustment layer LF. The wire layer WF is formed with a light blocking conductive material (for example, titanium nitride).

The relay electrode QF1 conducts electricity to the relay electrode QE1 through the conduction holes penetrating the first optical adjustment layer LF. As illustrated in FIG. 3, the relay electrode QF1 is formed to be overlapped with the opening portion 41A of the first power supply conductor 41 in the planar view. That is, the outer circumferential edge of the relay electrode QF1 is positioned outside of the inner circumferential edge of the opening portion 41A in the planar view. Since the relay electrode QF1 is formed with a light blocking conductive material, intrusion of the external light to the multilayered wire layer from the opening portion 41A is blocked by the relay electrode QF1. Accordingly, there is an advantage of preventing the current leakage in the respective transistors T caused by the emission of light. Meanwhile, the relay electrode QF4 in the mounting area 16 conducts electricity to the relay electrode QE4 of the wire layer WE through the conduction holes penetrating the first optical adjustment layer LF.

Figure 7:
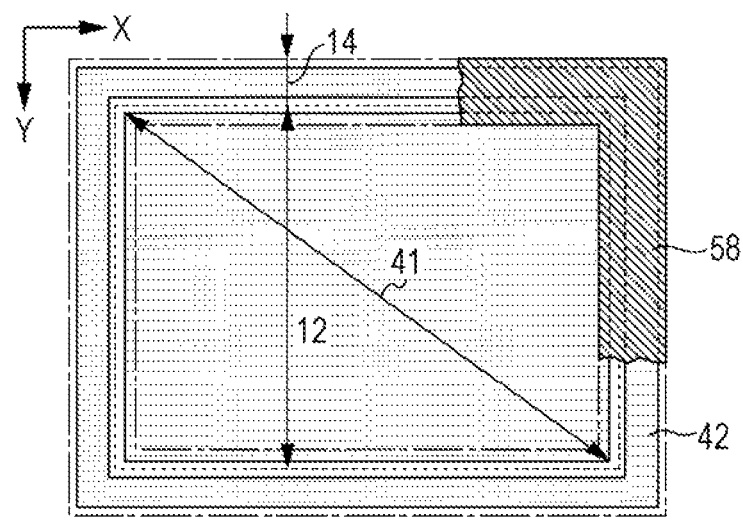
FIG. 7 is an explanatory diagram illustrating a positional relationship among a first power supply conductor, a second power supply conductor, and a protection conductive layer.

The protection conductive layer 58 of FIG. 3 conducts electricity to the second power supply conductor 42 through the conduction holes penetrating the first optical adjustment layer LF. FIG. 7 is an explanatory diagram illustrating a planar positional relationship of the first power supply conductor 41, the second power supply conductor 42, and the protection conductive layer 58. In FIG. 7, a portion of the protection conductive layer 58 is illustrated in solid lines, and an external form of another portion is illustrated in alternating long and short dashed lines.

As illustrated in FIG. 7, the protection conductive layer 58 is formed into a circular shape (rectangular frame shape) similar to that of the second power supply conductor 42, and formed into a belt shape in which both the first power supply conductor 41 and the second power supply conductor 42 are overlapped in the planar view. Specifically, the inner circumferential edge of the protection conductive layer 58 is positioned on the inner side of the circumferential edge of the first power supply conductor 41 in the planar view. That is, the protection conductive layer 58 is overlapped with the area in the vicinity of the circumferential edge in the first power supply conductor 41. The outer circumferential edge of the protection conductive layer 58 is positioned outside of the outer circumferential edge of the second power supply conductor 42 in the planar view. That is, the protection conductive layer 58 is overlapped on the entire portion of the second power supply conductor 42 in the planar view. As described above, the protection conductive layer 58 is overlapped with an area of the gap between the first power supply conductor 41 and the second power supply conductor 42 (that is, an area in the vicinity of the boundary between the display area 12 and the peripheral area 14) in the planar view.

As illustrated in FIG. 3, a second optical adjustment layer 60 is formed on the surface of the first optical adjustment layer LF on which the wire layer WF is formed. The first optical adjustment layer LF and the second optical adjustment layer 60 are light transmitting films that define the resonant wavelength of a resonant structure (specifically described below) of each of the pixels P. Specifically, the first optical adjustment layer LF and the second optical adjustment layer 60 are formed with a light transmitting insulation material such as a silicon compound (typically, silicon nitride or silicon oxide).

As illustrated in FIG. 3, the pixel electrode E1 for each of the pixels P in the display area 12, a conduction electrode 63 in the peripheral area 14, and the plurality of mounting terminals 38 in the mounting area 16 are formed from the same layer on the surface of the second optical adjustment layer 60. The pixel electrode E1, the conduction electrode 63, and the mounting terminals 38 are formed with a light transmitting conductive material such as Indium Tin Oxide (ITO). As illustrated in FIG. 2, the pixel electrode E1 is an almost rectangular-shaped electrode (pixel electrode) functioning as an anode of the light emitting device 45. The pixel electrode E1 conducts electricity to the relay electrode QF1 through the conduction holes penetrating the second optical adjustment layer 60. That is, the pixel electrode E1 conducts electricity to the active area 10A (drain) of the light emission control transistor TEL through respective relay electrodes (QF1, QE1, QD1, QC1, QB1, and QA1) of the multilayered wire layer. As described above, the respective relay electrodes (QF1, QE1, QD1, QC1, QB1, and QA1) of the multilayered wire layer electrically connect the pixel electrode E1 and the transistor (the light emission control transistor TEL in the example of the first embodiment). Meanwhile, the conduction electrode 63 in the peripheral area 14 conducts electricity to the protection conductive layer 58 through the conduction holes penetrating the second optical adjustment layer 60.

The respective mounting terminals 38 in the mounting area 16 appropriately conduct electricity to the wire line in the multilayered wire layer. For example, the mounting terminal 381 supplied by the high potential side power supply potential VEL conducts electricity to the connection conductor 52 (the conductive portion 522) through the respective relay electrode (QF4, QE4, QD4, and QC4) of the multilayered wire layer as illustrated in FIG. 3. Accordingly, the high-potential power supply potential VEL supplied to the mounting terminal 381 is supplied to the first power supply conductor 41 through the respective relay electrode (QF4, QE4, QD4, and QC4) and the connection conductor 52. The mounting terminal 382 supplied by the low potential side power supply potential VCT conducts electricity to the second power supply conductor 42 through the conductive portion 56 of the multilayered wire layer. Accordingly, the low potential side power supply potential VCT is supplied to the second power supply conductor 42.

As illustrated in FIG. 3, a pixel separation layer 65 is formed throughout the entire portion of the substrate 10 on the surface of the second optical adjustment layer 60 on which the pixel electrode E1, the conduction electrode 63, and the mounting terminals 38 are formed. The pixel separation layer 65 is formed by the inorganic insulation material such as a silicon compound (typically, silicon nitride or silicon oxide). As illustrated in FIG. 3, an opening portion 65A corresponding to the pixel electrode E1 in the display area 12, an opening portion 65B corresponding to the conduction electrode 63 in the peripheral area 14, and an opening portion 65C corresponding to the respective mounting terminals 38 in the mounting area 16 are formed on the pixel separation layer 65. The mounting terminals 38 are electrically connected to the external circuit through the opening portion 65C. That is, the opening portion 65A formed on the pixel separation layer 65 configures respective pixel areas in the light emitting device 100 described below. Hereinafter, the opening portion 65A may be referred to as a pixel area, if necessary.

As illustrated in FIG. 3, the organic layer 46 is formed on the surface of the second optical adjustment layer 60 on which the pixel separation layer 65 is formed. The organic layer 46 is formed in the display area 12, and is continuously provided along the plurality of pixels P. The organic layer 46 is not formed in the peripheral area 14 or the mounting area 16. For example, the organic layer 46 can be configured on the area in the peripheral area 14 on the display area 12 side. The organic layer 46 is configured to include the light emitting layer formed by the organic EL material. Though it is not illustrated in FIG. 3, the organic layer 46 includes a hole injection layer, a light emitting layer, and an electron injection layer (see FIG. 8). The organic layer 46 emits white light by the supply of the current. The white light has a spectrum of a blue wavelength region, a green wavelength region, and a red wavelength region, and has at least two peaks in a wavelength region of visible light.

The common electrode E2 is formed on both sides of the display area 12 and the peripheral area 14 on the surface of the second optical adjustment layer 60 on which the organic layer 46 is formed. As illustrated in FIG. 2, the common electrode E2 functions as a cathode of the light emitting device 45. As illustrated in FIG. 3, an area interposed between the pixel electrode E1 and the common electrode E2 inside the opening portion 65A of the pixel separation layer 65 in the organic layer 46 emits light as a light emitting area. That is, a portion inside the opening portion 65A in which the pixel electrode E1, the organic layer 46, and the common electrode E2 are stacked functions as the light emitting device 45. As described above, the pixel separation layer 65 regulates the planar shape or the dimension of the light emitting device 45 of each of the pixels P.

The light emitting device 100 according to the first embodiment is a display apparatus in which the light emitting device 45 is highly precisely disposed, that is, a micro display. For example, the dimension of one light emitting device 45 (the dimension of one opening portion 65A) is set to be 40 µm² or less. For example, the pitches of the respective light emitting device 45 adjacent to each other in the X direction are set to be 5 µm or less, and the gap between the light emitting devices 45 are set to be in the range of 1 µm to 2 µm. In addition, as described below, the film thickness of the organic layer configuring the light emitting device ranges approximately from 100 nm to 130 nm. Accordingly, the gap between the light emitting devices 45, that is, the gap between the adjacent pixel areas (the gap between the adjacent opening portions 65A), is approximately equal to or less than 20 times the film thickness of the organic layer.

As illustrated in FIG. 3, the portion positioned in the peripheral area 14 in the common electrode E2 conducts electricity to the conduction electrode 63 through the opening portion 65B of the pixel separation layer 65. The organic layer 46 is not formed on the area in which the conduction electrode 63 and the common electrode E2 conduct electricity, and on the area outside the area, in the peripheral area 14. That is, the common electrode E2 on both the display area 12 and the peripheral area 14 conducts electricity to the second power supply conductor 42 through the conduction electrode 63 and the protection conductive layer 58 in the peripheral area 14. Accordingly, the low potential side power supply potential VCT supplied to the mounting terminal 382 is supplied to the common electrode E2 through the conductive portion 56, the second power supply conductor 42, the protection conductive layer 58, and the conduction electrode 63.

The common electrode E2 of FIG. 3 functions as a transflective reflective layer having a property (transflective reflectivity) of transmitting a portion of the light reaching the front surface and reflecting the remaining portion. The transflective reflective common electrode E2 is formed by forming the light reflecting conductive material such as an alloy containing silver or magnesium to have a sufficiently thin film thickness. The radiated light from the organic layer 46 reciprocates between the first power supply conductor 41 and the common electrode E2, is transmitted by the common electrode E2 while the component of the specific resonant wavelength is selectively amplified, and is emitted to an observation side (the side opposite to the substrate 10). That is, a resonant structure in which the emitted light from the organic layer 46 is resonated is formed between the first power supply conductor 41 functioning as the reflecting layer and the common electrode E2 functioning as the transflective reflective layer. The second optical adjustment layer 60 is an element for setting resonant wavelengths (displayed color) of the resonant structure for each displayed color of the pixels P. Specifically, the resonant wavelengths of the emitted light of the respective pixels P are set for each displayed color by appropriately adjusting an optical path length (optical distance) between the first power supply conductor 41 and the common electrode E2 configuring the resonant structure according to the film thicknesses of the first optical adjustment layer LF and the second optical adjustment layer 60.

As illustrated in FIG. 3, a sealing layer 70 extending to the display area 12 and the peripheral area 14 is formed on the surface of the common electrode E2. The sealing layer 70 is a light transmitting film that prevents the intrusion of the external air and the moisture by sealing respective components formed on the substrate 10. The sealing layer 70 is formed by a single layer or multiple layers of the inorganic material or the organic material. As illustrated in FIG. 3, the sealing layer 70 is not formed on the mounting area 16, and the respective mounting terminals 38 are exposed on the mounting area 16.

Figure 8:
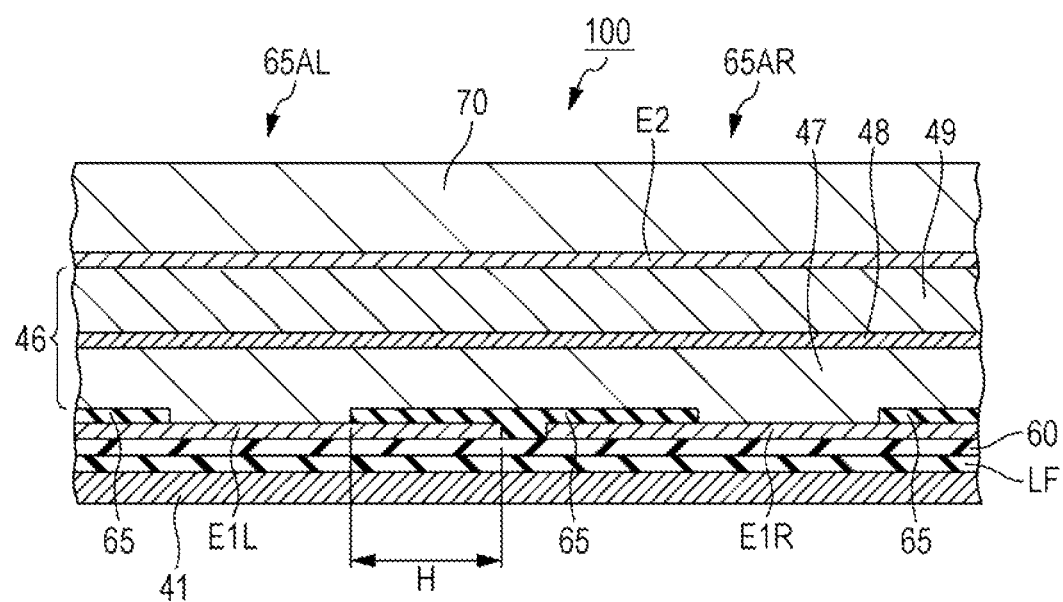
FIG. 8 is a cross-sectional view extracting and illustrating a configuration on the upper surface than the first power supply conductor.

FIG. 8 is a cross-sectional view illustrating two adjacent pixel areas. Further, in FIG. 8, the components higher on the layer side than the first power supply conductor 41 are extracted and illustrated. Hereinafter, for easier description, the pixel area on the left side of FIG. 8 is referred to as a first pixel area 65AL, the pixel area on the right side is referred to as a second pixel area 65AR, the pixel electrode of the first pixel area 65AL on the left side is referred to as a first pixel electrode E1L, and the pixel electrode of the second pixel area 65AR on the right side is referred to as a second pixel electrode E1R.

The pixel separation layer 65 that divides the first pixel area 65AL and the second pixel area 65AR is provided on the area interposed between the first pixel electrode and the second pixel electrode, on the upper surface of the second optical adjustment layer 60. Though it is not illustrated in FIG. 3, the organic layer 46 includes a hole injection layer (charge transfer layer) 47, a light emitting layer 48, and an electron injection layer 49 in a sequence from the lower layer side to the upper layer side. Further, the organic layer 46 may include a hole transfer layer and a charge transfer layer.

Accordingly, in the embodiment, the hole injection layer 47 is provided to cover the upper surface of the first pixel electrode, the upper surface of the second pixel electrode, and the pixel separation layer 65.

FIG. 8 is focused on three configurations as follows.

(1) The first pixel electrode E1L and the second pixel electrode E1R are provided to have a gap therebetween so as to be in contact with the hole injection layer 47.

(2) The pixel separation layer 65 is formed in a manner covering outer edge portions of the first pixel electrode E1L and the second pixel electrode E1R, a portion of the first pixel electrode E1L and the second pixel electrode E1R facing the hole injection layer 47 through the pixel separation layer 65.

(3) The width overlapped between the first pixel electrode and the second pixel electrode on the pixel separation layer 65 is greater than the film thickness of the organic layer 46.

When the configurations (1) to (3) are focused on, in the first pixel electrode E1L and the second pixel electrode E1R, if the portion overlapped with the pixel separation layer 65 is considered as a gate, and the other portion is considered as one of the source or the drain, it can be virtually diagnosed that a TFT in which the organic layer 46 (the hole injection layer 47) on the pixel separation layer 65 in which the first pixel electrode E1L and the second pixel electrode E1R are overlapped is set as the channel area is subjected to the diode connection. Here, since the gate and one of the source or the drain are configured with the same first pixel electrode E1L (the second pixel electrode E1R), the gate and one of the source or the drain are electrically connected. In addition, the other one of the source and the drain is the organic layer 46 (the hole injection layer 47) in which the first pixel electrode E1L and the second pixel electrode E1R are not overlapped. Hereinafter, one set of TFT subjected to the diode connection is referred to as a virtual diode connection structure.

Figure 9:
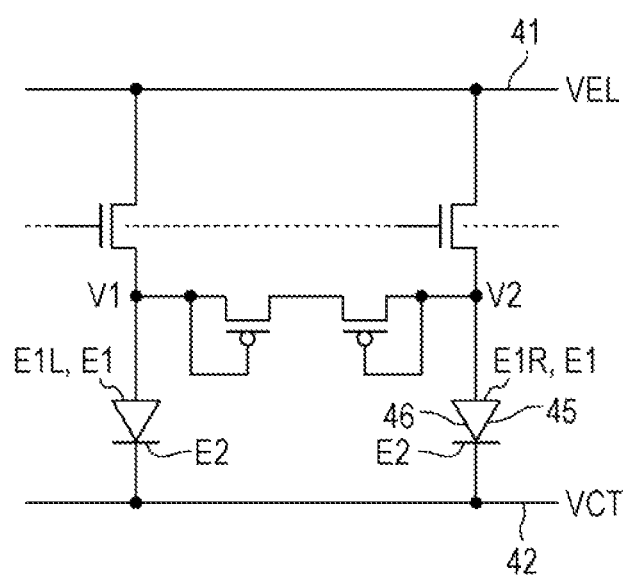
FIG. 9 is an equivalent circuit diagram illustrating a first pixel area and a second pixel area.

FIG. 9 is a diagram illustrating a leakage current reduction principle according to the embodiment and an equivalent circuit diagram illustrating two pixel areas of the first pixel area 65AL and the second pixel area 65AR. In FIG. 2 described above, the equivalent circuit of one pixel area is illustrated, but in the components of FIG. 2, the light emission control transistor TEL, the selection transistor TSL, the capacitive element C and the like which do not directly relate to the description below are not illustrated.

It is assumed that the first pixel area 65AL is caused to emit light at relatively high brightness, and the second pixel area 65AR is caused to emit light at relatively low brightness. At this point, for example, 5 V of the potential V1 is supplied to the first pixel electrode E1L, and, for example, 2 V of the potential V2 is supplied to the second pixel electrode E1R. As illustrated in FIG. 9, in a first drive transistor TDR1, either the source or the drain is electrically connected to the first pixel electrode E1L, and the other one is electrically connected to the first power supply conductor 41. In the same manner, in a second drive transistor TDR2, either the source or the drain is electrically connected to the second pixel electrode E1R, and the other one is electrically connected to the first power supply conductor 41.

Further, the element which is connected to the current path between the first pixel electrode E1L and the first power supply conductor 41 may not be the first drive transistor TDR1 only, but may also include other transistors (for example, the light emission control transistor TEL and the selection transistor TSL described above), a resistor, a diode, a capacitive element, or the like. Accordingly, a state in which the first drive transistor TDR1 is electrically connected to a portion between the first pixel electrode E1L and the first power supply conductor 41 includes a configuration in which the elements described above are included. The second drive transistor TDR2 is configured in the same manner.

If a potential V1 of the first pixel electrode E1L is 5 V, and a potential V2 of the second pixel electrode E1R is 2 V, the TFT subjected to the diode connection is switched off in the virtual diode connection structure with respect to the first pixel area 65AL, and the TFT subjected to the diode connection is switched on in the virtual diode connection structure with respect to the second pixel area 65AR. At this point, since the resistance between the first pixel electrode E1L and the second pixel electrode E1R becomes high, it is difficult for the current to flow between the first pixel electrode E1L and the second pixel electrode E1R. Accordingly, it is possible to reduce the leakage current between the first pixel electrode E1L and the second pixel electrode E1R, compared with a case in which the virtual diode connection structure is not provided. Further, when the potential V1 of the first pixel electrode E1L is the same as the potential V2 of the second pixel electrode E1R, for example, both are 2 V or 5 V, the leakage current does not flow between the first pixel electrode and the second pixel electrode.

In order to cause the aforementioned virtual diode connection structure to effectively function, it is necessary to sufficiently secure the width overlapped with the pixel separation layer 65 functioning as the gate insulation film between the first pixel electrode E1L and the second pixel electrode E1R. Therefore, according to the embodiment, in order for the virtual diode connection structure to function effectively, a width H overlapped between the pixel separation layer 65 and the first pixel electrode E1L in the planar view and the width H overlapped between the pixel separation layer 65 and the second pixel electrode E1R in the planar view are set to be greater than the film thickness of the organic layer 46. Further, according to the embodiment, the overlapped width H is set to be greater than the film thickness of the hole injection layer 47 in the organic layer 46. In addition, according to the embodiment, the film thickness of the pixel separation layer 65 is desirably thinner than the film thickness of the organic layer 46. Further, the overlapped width is desirably equal to or greater than 3 times and equal to or less than 10 times the film thickness of the organic layer 46.

That is, if the film thickness of the pixel separation layer 65 is t, and the film thickness of the organic layer 46 is toled, it is desirable to satisfy $t < toled$, and $toled \times 3 \leq H \leq toled \times 10$.

As a specific example, the film thickness of the organic layer 46 is 130 nm, the film thickness of the hole injection layer 47 is 50 nm, the film thickness of the pixel separation layer 65 is 20 nm, the overlapped width H is 400 nm, the gap between the first pixel area 65AL and the second pixel area 65AR is 1000 nm, and the pixel dimension is 40 $\mu m^2$ or less. In this case, since the overlapped width H is 400 nm, and the film thickness toled of the organic layer 46 is 130 nm, t<toled and toledx3≤H≤toledx10 are satisfied. In addition, since the overlapped width H is 400 nm, the film thickness of the hole injection layer 47 is greater than 50 nm, and the aforementioned condition is satisfied.

In addition, if the gap between the first pixel area 65AL and the second pixel area 65AR is 2,000 nm, the overlapped width H is 800 nm. This case also satisfies the aforementioned condition.

As a countermeasure against the typical leakage current in the light emitting device, the countermeasure of, for example, increasing the resistance value of the hole injection layer, digging a groove for insulation between the adjacent pixel areas, or the like is reviewed. However, when the resistance value of the hole injection layer is increased, a high voltage is required for driving the light emitting device. Therefore, it is difficult to reduce the drive voltage to a low voltage. In addition, when the groove for insulation is dug between the adjacent pixel areas, it is difficult to refine pixels, and accordingly, the sealing becomes difficult. In this manner, the respective countermeasures have problems.

In contrast, in the light emitting device 100 according to the embodiment, the hole injection layer 47 is disposed through the pixel separation layer 65 having a greater width than the film thickness of the organic layer 46 on the upper side of the adjacent pixel electrodes E1. The configuration is equivalent to a configuration in which an organic transistor virtually subjected to the diode connection is provided between the adjacent pixel electrodes. According to this, though the gap between the adjacent pixel electrodes is short, it is possible to sufficiently decrease the leakage current between the adjacent electrodes. According to the condition, in the light emitting device 100 according to the embodiment, it is possible to decrease the value of the leakage current up to 1/10 or less of the leakage current of the light emitting device in the related art which does not have the configuration described above.

Second Embodiment

Hereinafter, a second embodiment according to the invention is described with reference to FIG. 10.

The basic configuration of the light emitting device according to the second embodiment is the same as that of the light emitting device of the first embodiment, and is a top emission-type organic EL apparatus. The light emitting device according to the second embodiment is different from the light emitting device according to the first embodiment in that a resonator structure optimized for each pixel is provided.

Figure 10:
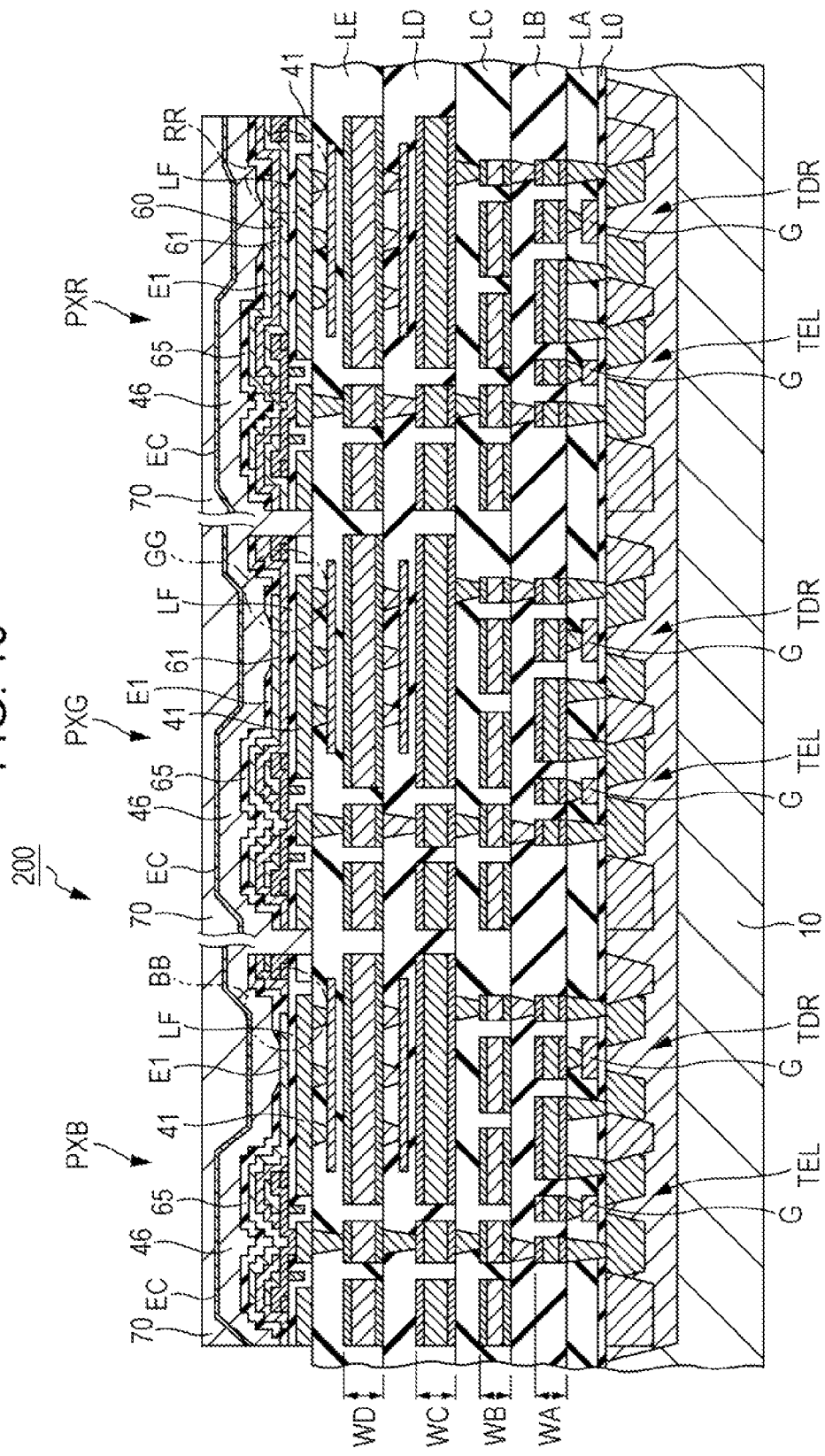
FIG. 10 is a cross-sectional view illustrating a light emitting device according to a second embodiment.

FIG. 10 is a cross-sectional view illustrating the light emitting device according to the second embodiment.

In FIG. 10, the same components as in FIG. 3 used in the first embodiment are denoted by the same reference numerals, and the detailed descriptions thereof are omitted.

In the cross-sectional view of FIG. 10, a pixel area on the left side indicates a blue pixel area PXB, a pixel area in the center indicates a green pixel area PXG, and a pixel area on the right side indicates a red pixel area PXR.

In a light emitting device 200 according to the second embodiment, the plurality of conductors are illustrated as a single metal layer or a stacked film of two to three metal layers. The first power supply conductor 41 is configured with a stacked film of titanium (Ti)/aluminum copper alloy (AlCu). In the same manner as the first embodiment, the first power supply conductor 41 is formed across the adjacent pixel areas. Accordingly, the first power supply conductor 41 is positioned on the lower side of the pixel electrode E1, and extends to the outside of the pixel electrode E1.

In the blue pixel area PXB, the first optical adjustment layer LF is formed to cover the first power supply conductor 41 on the upper surface of the insulation layer LE. The pixel electrode E1 is formed on the upper surface of the first optical adjustment layer LF. The portion indicated by reference numeral BB of FIG. 10 corresponds to the stacked structure between the adjacent pixel electrodes. In view of the portions indicated by reference numeral BB, the pixel separation layer 65 is formed to cover the outer edge portion of the pixel electrode E1 in the same manner as in the first embodiment.

In the green pixel area PXG, the first optical adjustment layer LF is formed to cover the first power supply conductor 41 on the upper surface of the insulation layer LE. A third optical adjustment layer 61 is formed on the upper surface of the first optical adjustment layer LF. The pixel electrode E1 is formed on the upper surface of the third optical adjustment layer 61. The portion indicated by reference numeral GG of FIG. 10 corresponds to the stacked structure between the adjacent pixel electrodes. In view of the portion indicated by reference numeral GG, the pixel separation layer 65 is formed to cover the outer edge portion of the pixel electrode E1 in the same manner as in the first embodiment.

In the red pixel area PXR, the first optical adjustment layer LF is formed to cover the first power supply conductor 41 on the upper surface of the insulation layer LE. The second optical adjustment layer 60 is formed on the upper surface of the first optical adjustment layer LF. The third optical adjustment layer 61 is formed on the upper surface of the second optical adjustment layer 60. The pixel electrode E1 is formed on the upper surface of the third optical adjustment layer 61. The portion indicated by reference numeral RR of FIG. 10 corresponds to the stacked structure between the adjacent pixel electrodes. In view of the portion indicated by reference numeral RR, the pixel separation layer 65 is formed to cover the outer edge portion of the pixel electrode E1 in the same manner as in the first embodiment.

Also in the second embodiment, the width H overlapped with the pixel electrode E1 on the pixel separation layer 65 configuring the virtual diode connection structure is desirably greater than the film thickness of the organic layer 46. Further, also in the second embodiment, the pixel separation layer 65 is configured with the gate insulation film.

As a specific example, the film thickness of the first optical adjustment layer LF is 50 nm, the film thickness of the second optical adjustment layer 60 is 50 nm, the film thickness of the third optical adjustment layer 61 is 50 nm, the film thickness of the pixel separation layer 65 is 20 nm, and the film thickness of organic layer is 130 nm.

In this case, in the blue pixel area PXB, since the gate insulation film is configured with the pixel separation layer 65, the film thickness t of the insulation film is 20 nm and the film thickness toled of the organic layer 46 is 130 nm.

In addition, in the green pixel area PXG, since the gate insulation film is configured with the pixel separation layer 65, the film thickness of the insulation film is 20 nm, and the film thickness toled of the organic layer 46 is 130 nm.

In addition, in the red pixel area PXR, since the gate insulation film is configured with the pixel separation layer 65, the film thickness t of the insulation film is 20 nm, and the film thickness of the organic layer 46 is 130 nm.

In the light emitting device 200 according to the embodiment, the effect of sufficiently decreasing the leakage current between the adjacent electrodes in the same manner as in the first embodiment can be obtained by the virtual diode connection structure between the adjacent pixel electrodes E1. In addition, it is possible to realize a color light emitting device having an optimum resonator length for each of the pixel areas of the respective colors.

Third Embodiment

Hereinafter, a third embodiment according to the invention is described with reference to FIG. 11.

The light emitting device according to the third embodiment is different from the light emitting device es according to the first and second embodiments, but is an example of a bottom emission-type organic EL apparatus in which light from the light emitting layer is emitted from the substrate side.

Figure 11:
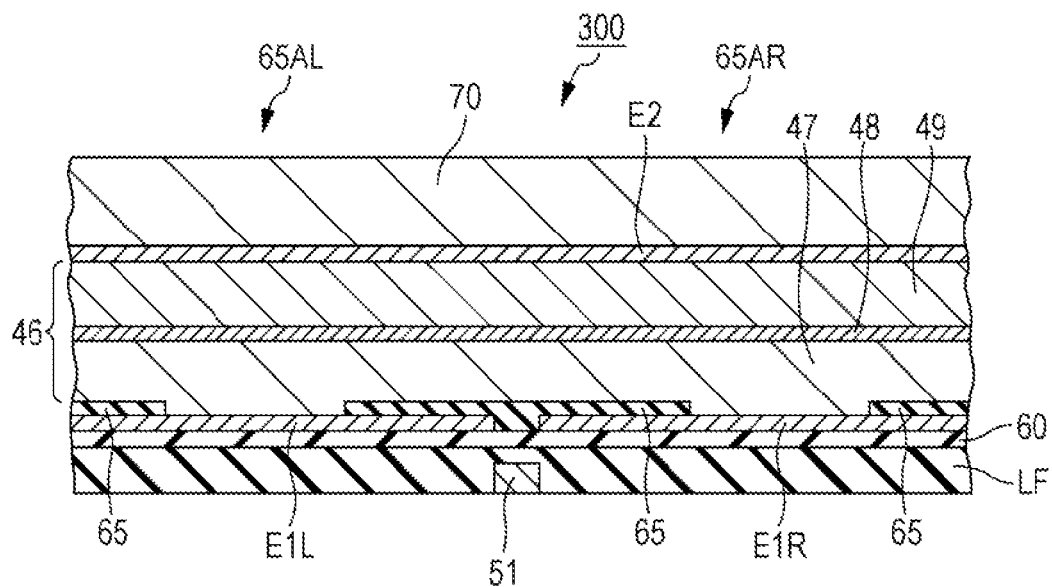
FIG. 11 is a cross-sectional view illustrating a light emitting device according to a third embodiment.

FIG. 11 is a cross-sectional view illustrating a light emitting device according to the third embodiment.

In FIG. 11, the same components as in FIG. 8 used in the first embodiment are denoted by the same reference numerals, and the detailed descriptions thereof are omitted.

As illustrated in FIG. 11, in a light emitting device 300 according to the third embodiment, a first power supply conductor 51 is provided on the lower layers of the first pixel electrode E1L and the second pixel electrode E1R through the first optical adjustment layer LF and the second optical adjustment layer 60. The first power supply conductor 51 is formed with a light reflecting conductive material containing aluminum, silver, or the like. However, while the first power supply conductor 41 is disposed right below the first pixel electrode E1L and the second pixel electrode E1R according to the first and second embodiments, the first power supply conductor 51 is not disposed right below the first pixel electrode E1L and the second pixel electrode E1R according to the embodiment. In other words, the first power supply conductor 51 has opening portions 51H right below the first pixel electrode E1L and the second pixel electrode E1R.

According to the embodiment, the width H overlapped between the first pixel electrode E1L and the second pixel electrode E1R on the pixel separation layer 65 which configures the virtual diode connection structure is greater than the film thickness of the organic layer 46.

The components such as various kinds of transistors, capacitive elements, and wire lines illustrated in FIG. 3 are disposed on an area other than the opening portions 51H of the first power supply conductor 51, that is, on an area other than the light transmitting area. A common electrode EC is formed with the light reflecting conductive material containing aluminum, silver, or the like. Accordingly, the light emitted from the light emitting layer 48 is reflected on the common electrode EC, is transmitted by the first pixel electrode E1L or the second pixel electrode E1R, and is emitted from the substrate side through the opening portions 51H of the first power supply conductor 51.

In the light emitting device 300 according to the present embodiment, the effect of sufficiently decreasing the leakage current between the adjacent electrodes in the same manner as in the first and second embodiments can be obtained by the virtual diode connection structure between the adjacent pixel electrodes E1L and E1R.

Fourth Embodiment

Hereinafter, a fourth embodiment of the invention is described with reference to FIG. 12.

The light emitting device according to the fourth embodiment is an example of the bottom emission-type organic EL apparatus in the same manner as in the third embodiment.

Figure 12:
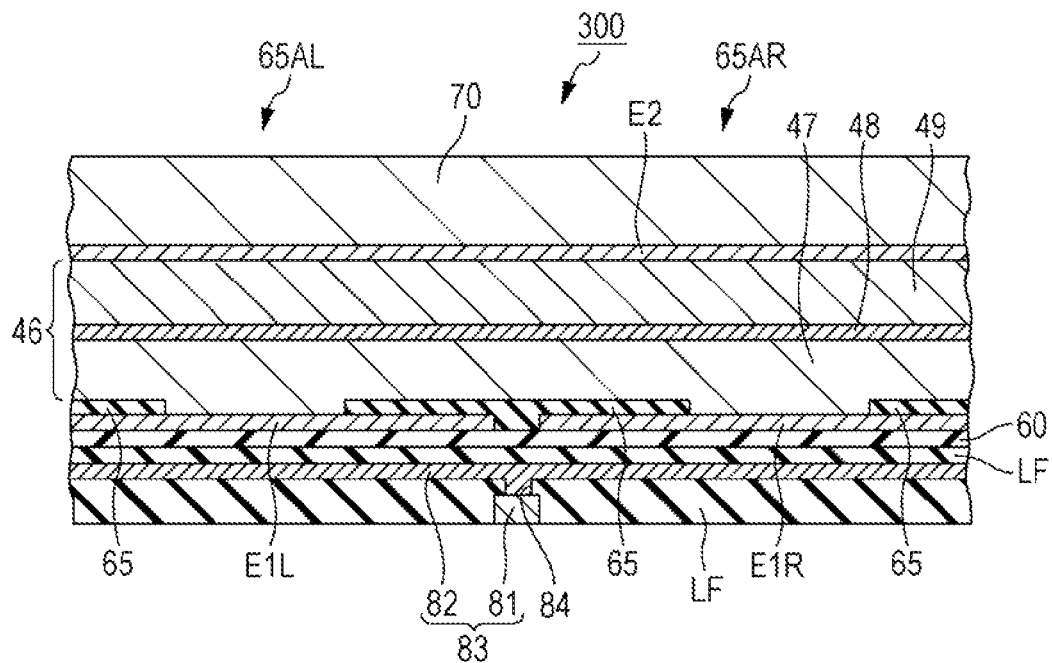
FIG. 12 is a cross-sectional view illustrating a light emitting device according to a fourth embodiment.

FIG. 12 is a cross-sectional view illustrating a light emitting device according to the fourth embodiment.

In FIG. 12, the same components as in FIG. 8 used in the first embodiment are denoted by the same reference numerals, and the detailed descriptions thereof are omitted.

As illustrated in FIG. 12, in a light emitting device 400 according to the fourth embodiment, a first power supply conductor 83 includes a first conductor 81 configured with a light reflecting material and a second conductor 82 configured with a light transmitting material. The first conductor 81 is formed with a light reflecting conductive material containing aluminum, silver, or the like. The second conductor 82 is formed with a light transmitting conductive material such as ITO. The first conductor 81 is provided on an area between the first pixel area 65AL and the second pixel area 65AR in the planar view. The second conductor 82 is provided across the first pixel area 65AL and the second pixel area 65AR in the planar view. The second conductor 82 is provided between the first pixel electrode E1L and the substrate (not illustrated), and between the second pixel electrode E1R and the substrate, and is electrically connected to the first conductor 81 through a contact hole 84 penetrating the first optical adjustment layer. A high potential for driving the light emitting device is supplied to the first power supply conductor 83 in the same manner as in the first and second embodiments.

According to the embodiment, the width H overlapped between the first pixel electrode E1L and the second pixel electrode E1R in the pixel separation layer 65 configuring the virtual diode connection structure is greater than the thickness of the organic layer 46.

The components such as various kinds of transistors, capacitive elements, and wire lines illustrated in FIG. 3 are disposed on an area under the first conductor 81, that is, an area other than the light transmitting area. The common electrode EC is formed with the light reflecting conductive material containing aluminum, silver, or the like. Accordingly, the light emitted from the light emitting layer 48 is reflected on the common electrode EC, is sequentially transmitted by the first pixel electrode E1L or the second pixel electrode E1R, and the second conductor 82, and is emitted from the substrate side.

In the light emitting device 400 according to the embodiment, the effect of sufficiently decreasing the leakage current between the adjacent electrodes in the same manner as in the first to third embodiments can be obtained by the virtual diode connection structure between the adjacent pixel electrodes E1L and E1R. In addition, a light transmitting material such as ITO configuring the second conductor 82 generally has high resistivity. However, since the second conductor 82 is electrically connected to the first conductor 81, the first conductor 81 plays a role of decreasing the resistivity of the second conductor 82.

Electronic Apparatus

Figure 13:
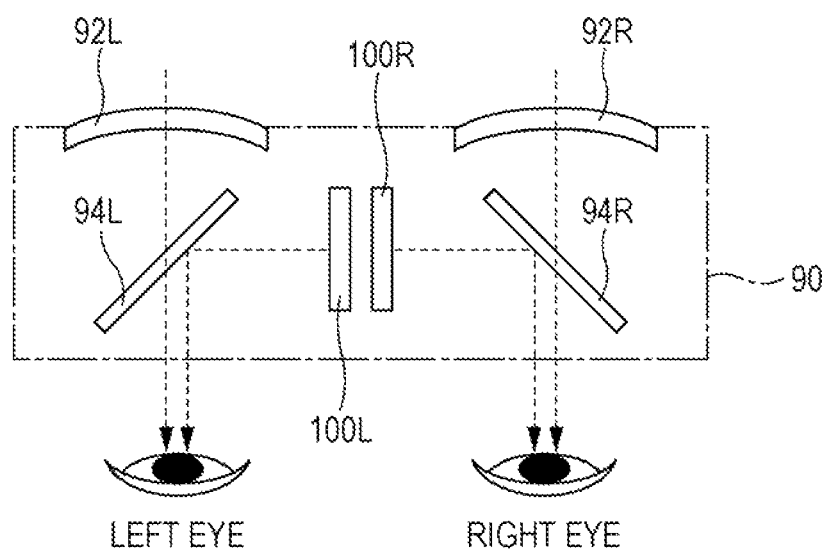
FIG. 13 is a diagram schematically illustrating a head mounted display apparatus which is an example of an electronic apparatus.

The light emitting device 100 described as an example according to the respective embodiments above are appropriately used as a display apparatus of various kinds of electronic apparatuses. In FIG. 13, a head mounted display apparatus 90 (HMD) using the light emitting device 100 described as an example in the respective embodiments is illustrated as an example of the electronic apparatus.

A display apparatus 90 is the electronic apparatus that can be mounted on the head of a human, and includes a transmitting portion (lens) 92L overlapped with the left eye of a user, a transmitting portion 92R overlapped with the right eye of the user, a light emitting device 100L and a half mirror 94L for the left eye, and a light emitting device 100R and a half mirror 94R for the right eye. The light emitting device 100L and the light emitting device 100R are disposed so that emitted light proceeds in directions opposite to each other. The half mirror 94L for the left eye causes the transmitted light of the transmitting portion 92L to be transmitted to the left eye side of the user, and the emitted light from the light emitting device 100L is reflected to the left eye side of the user. In the same manner, the half mirror 94R for the right eye causes the transmitted light of the transmitting portion 92R to be transmitted to the right eye side of the user and causes the emitted light from the light emitting device 100R to be reflected to the right eye side of the user.

Accordingly, the user perceives an image obtained by superimposing an image observed through the transmitting portion 92L and the transmitting portion 92R and an image displayed by the light emitting device 100. In addition, it is possible to cause the user to perceive a stereoscopic vision of the displayed image by displaying stereoscopic images (the image for the left eye and the image for the right eye) in which parallax is mutually given, on the light emitting device 100L and the light emitting device 100R.

Further, the electronic apparatus to which the light emitting device 100 according to the embodiments is applied is not limited to the display apparatus 90 of FIG. 13. For example, the light emitting device according to the invention may be preferably applied to an Electronic View Finder (EVF) which is used in an image capturing apparatus such as a video camera or a still camera. In addition, the light emitting device according to the invention can be applied to various kinds of electronic apparatuses such as a mobile phone, a mobile information terminal (smart phone), a television, a monitor of a personal computer, or a car navigation apparatus.

Further, the technical scope of the invention is not limited to the embodiments described above, but various changes can be added without departing from the gist of the invention. Configuration materials, shapes, dispositions, dimensions, film thicknesses, and the like of various kinds of electrodes, wire lines, transistors, capacitive elements, insulation films, or the like in the light emitting device according to the embodiments described above are described as an example, and can be appropriately modified.

The entire disclosure of Japanese Patent Application No. 2013-195080, filed Sep. 20, 2013 is expressly incorporated by reference herein.

What is claimed is:

1. A light emitting device comprising:
a first pixel electrode;
a second pixel electrode;
an organic layer including a light emitting layer;
a pixel separation layer interposed between an edge portion of the first pixel electrode and an edge portion of the second pixel electrode, the pixel separation layer also interposed between the organic layer and the first pixel electrode, and the pixel separation layer also interposed between the organic layer and the second pixel electrode; and
a common electrode provided on the organic layer,
wherein the pixel separation layer and the first pixel electrode overlap by a first width in the planar view and the pixel separation layer and the second pixel electrode overlap by a second width in the planar view, and each of the first width and the second width is greater than a thickness of the organic layer.

2. The light emitting device according to claim 1,
wherein a thickness of the pixel separation layer is thinner than the thickness of the organic layer.

3. The light emitting device according to claim 1,
wherein the overlapped widths are equal to or greater than 3 times and equal to or less than 10 times the thickness of the organic layer.

4. The light emitting device according to claim 1,
wherein a gap between a first pixel area of the first pixel electrode and a second pixel area of the second pixel electrode is equal to or less than 20 times the thickness of the organic layer.

5. A light emitting device comprising:
a first pixel electrode;
a second pixel electrode;
a light emitting layer;
a charge transfer layer provided between the light emitting layer, and the first pixel electrode and the second pixel electrode;
a pixel separation layer interposed between an edge portion of the first pixel electrode and an edge portion of the second pixel electrode, the pixel separation layer also interposed between the charge transfer layer and the first pixel electrode, and the pixel separation layer also interposed between the organic layer and the second pixel electrode; and
a common electrode provided on the light emitting layer,
wherein the pixel separation layer and the first pixel electrode overlap by a first width in the planar view and the pixel separation layer and the second pixel electrode overlap by a second width in the planar view, and each of the first width and the second width is greater than a thickness of the charge transfer layer.

6. The light emitting device according to claim 5,
wherein a thickness of the pixel separation layer is thinner than the thickness of the charge transfer layer.

7. The light emitting device according to claim 5,
wherein the overlapped width is equal to or greater than 3 times and equal to or less than 10 times the thickness of the organic layer including the light emitting layer and the charge transfer layer.

8. The light emitting device according to claim 5,
wherein a gap between a first pixel area of the first pixel electrode and a second pixel area of the second pixel electrode is equal to or less than 20 times the thickness of the organic layer including the light emitting layer and the charge transfer layer.

9. The light emitting device according to claim 1,
wherein light emitted from the light emitting layer is emitted from the common electrode side.

10. The light emitting device according to claim 1,
wherein light emitted from the light emitting layer is emitted from the first pixel electrode or the second pixel electrode.

11. An electronic apparatus comprising the light emitting device according to claim 1.

12. An electronic apparatus comprising the light emitting device according to claim 2.

13. An electronic apparatus comprising the light emitting device according to claim 3.

14. An electronic apparatus comprising the light emitting device according to claim 4.

15. An electronic apparatus comprising the light emitting device according to claim 5.

16. An electronic apparatus comprising the light emitting device according to claim 6.

17. An electronic apparatus comprising the light emitting device according to claim 7.

18. An electronic apparatus comprising the light emitting device according to claim 8.

19. An electronic apparatus comprising the light emitting device according to claim 9.

20. An electronic apparatus comprising the light emitting device according to claim 10.

\* \* \* \* \*

UNITED STATES PATENT AND TRADEMARK OFFICE
CERTIFICATE OF CORRECTION

Page 1 of 1

PATENT NO. : 9,806,135 B2
APPLICATION NO. : 14/476281
DATED : October 31, 2017
INVENTOR(S) : Takeshi Koshihara It is certified that error appears in the above-identified patent and that said Letters Patent is hereby corrected as shown below:

In the Claims

At Column 22, Claim number 5, Line 28, "the organic layer" should be changed to --the charge transfer layer--;

At Column 22, Claim number 7, Line 43, "the organic layer" should be changed to --an organic layer--; and At Column 22, Claim number 8, Line 49, "the organic layer" should be changed to --an organic layer--.

Signed and Sealed this
Sixth Day of April, 2021

Drew Hirshfeld
*Performing the Functions and Duties of the
Under Secretary of Commerce for Intellectual Property and
Director of the United States Patent and Trademark Office*